United States Patent
Welty

(10) Patent No.: US 8,040,171 B2
(45) Date of Patent: Oct. 18, 2011

(54) ACCELERATOR OUTPUT STAGE THAT ADJUSTS DRIVE DURATION TO LOADING

(75) Inventor: Mark B. Welty, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1129 days.

(21) Appl. No.: 11/382,995

(22) Filed: May 12, 2006

(65) Prior Publication Data

US 2006/0261872 A1    Nov. 23, 2006

Related U.S. Application Data

(60) Provisional application No. 60/683,934, filed on May 23, 2005.

(51) Int. Cl.
*H03K 5/12* (2006.01)
(52) U.S. Cl. ........................................... 327/170
(58) Field of Classification Search .................. None
See application file for complete search history.

(56) References Cited

U.S. PATENT DOCUMENTS

| | | | |
|---|---|---|---|
| 6,492,846 B1 * | 12/2002 | Taguchi et al. | 327/112 |
| 7,164,600 B2 * | 1/2007 | Ba | 365/185.02 |
| 2001/0017554 A1 * | 8/2001 | Tsuji | 327/112 |
| 2003/0071663 A1 * | 4/2003 | Taguchi et al. | 327/112 |

* cited by examiner

*Primary Examiner* — Lincoln Donovan
*Assistant Examiner* — Khareem E Almo
(74) *Attorney, Agent, or Firm* — John J. Patti; Wade J. Brady, III; Frederick J. Telecky, Jr.

(57) ABSTRACT

The accelerator output stage circuit includes: a high side output device coupled to an output node; a low side output device coupled to the output node; a first logic gate coupled to a control node of the first high side output device; a second logic gate coupled to a control node of the second high side output device; a high side one-shot device having an output coupled to a first input of the first logic gate; a low side one-shot device having an output coupled to a first input of the second logic gate; and a feedback device coupled between the output node and a second input of the first logic gate, and between the output node and a second input of the second logic gate, and between the output node and the input to the high side resistor bypass device, and between the output node and the input to the low side one-shot resistor bypass device.

15 Claims, 1 Drawing Sheet

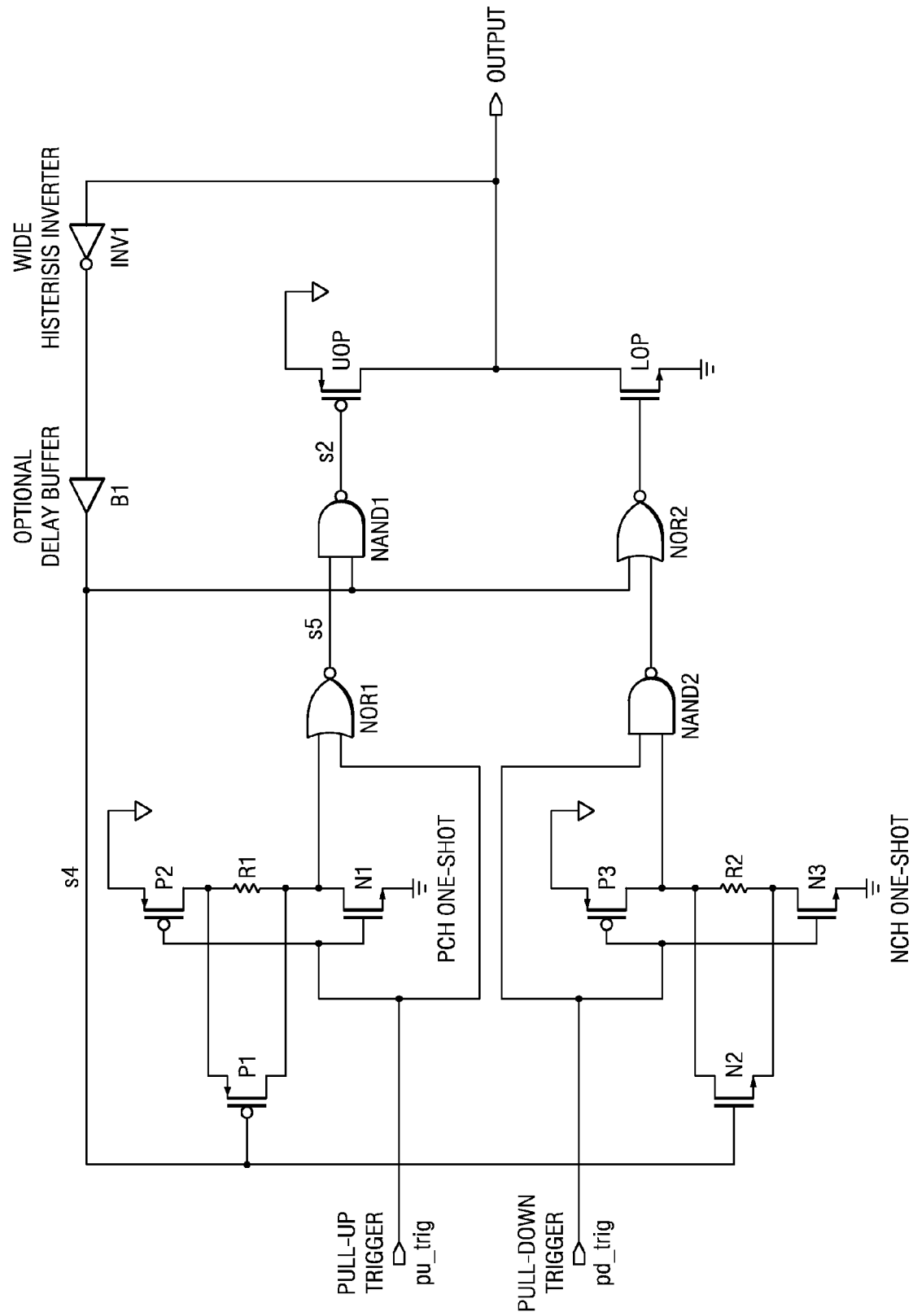

ACCELERATOR OUTPUT STAGE THAT ADJUSTS DRIVE DURATION TO LOADING

FIELD OF THE INVENTION

The present invention relates to electronic circuitry and, in particular, to an accelerator output stage that adjusts drive duration to loading.

BACKGROUND OF THE INVENTION

In circuits such as bidirectional level translators, the output driver may use an accelerator output stage to speed up the output transition. Traditionally, the accelerator output stage drivers are controlled by a one-shot with a fixed pulse width. Fixing the duration of the accelerator drive limits the maximum switching frequency and/or the maximum capacitive load that can be driven. If the duration of the accelerator drive is set longer to allow driving heavier capacitive loads, then the maximum switching frequency will decrease and vice versa.

Previous bidirectional translator circuits have used a one-shot with fixed pulse width to control the duration of the accelerator drive. In doing so, one must accept either a lower switching speed, lower load driving capability, or reduced signal integrity. With fixed duration one-shots, there is a trade-off between load driving capability, max switching frequency, and dynamic ICC current. On the high end of the one-shot duration, the maximum switching frequency (without contention between the upper and lower drivers) is limited. On the low end of the one-shot duration, the maximum bus capacitance that can be driven rail-to-rail is limited. One can allow some contention (overlap of P channel high-side driver and N channel low-side driver one-shot pulses) but dynamic ICC current goes up.

SUMMARY OF THE INVENTION

An accelerator output stage circuit, according to the present invention, includes: a high side output device coupled to an output node; a low side output device coupled to the output node; a first logic gate coupled to a control node of the first high side output device; a second logic gate coupled to a control node of the second high side output device; a high side one-shot device having an output coupled to a first input of the first logic gate; a low side one-shot device having an output coupled to a first input of the second logic gate; and a feedback device coupled between the output node and a second input of the first logic gate, and between the output node and a second input of the second logic gate, and between the output node and an input to a high side resistor bypass device, and between the output node and an input to a low side resistor bypass device.

BRIEF DESCRIPTION OF THE DRAWINGS

In the drawings:
The Drawing is a circuit diagram of a preferred embodiment accelerator output stage.

DETAILED DESCRIPTION OF PREFERRED EMBODIMENTS

The accelerator output stage circuit, according to the present invention, adjusts the duration of the accelerator output drive based on the output loading. The preferred embodiment accelerator output stage circuit shown in FIG. 1 includes: P channel transistors P1, P2, and P3; N channel transistors N1, N2, and N3; NOR gates NOR1 and NOR2; NAND gates NAND 1 and NAND 2; high side output transistor UOP; low side output transistor LOP; wide hysterisis inverter INV1; optional delay buffer B1; and inputs pu_trig (pull-up trigger) and pd_trig (pull-down trigger). A high side (P channel) one-shot device is formed by transistors P1, P2, N1, NOR gate NOR1, and resistor R1. A low side (N channel) one-shot device is formed by transistors N2, N3, P3, NAND gate NAND2, and resistor R2.

Referring to FIG. 1, the circuit has two inputs, pu_trig and pd_trig, that trigger the accelerator output state to pull up the output or pull down the output, respectively. The circuit has one output which would be connected to the load being driven. First, assume that the circuit is in a steady-state condition with output low, node pu_trig high, and node pd_trig low. Upon receiving a low signal on node pu_trig, node s2 will go low and cause the output to be pulled high by P channel transistor UOP. Once the output is very near the positive rail, inverter INV1 will force node s4 low and kill the drive from transistor UOP by forcing node s2 high though NAND gate NAND1. Transistor P1 (resistance bypass) will also be turned on by node s4, which will in turn force node s5 low through NOR gate NOR1. External control logic will return input node pu_trig to a high state such that the circuit is ready for another pull-up cycle. The operation of the circuit for the pull-down cycle can be similarly derived. Transistor P2 and resistor R1 combination, and transistor N3 and resistor R2 combination are set sufficiently weak (using long channel, series resistance, or other means) to allow the drive duration to be determined by the feedback through inverter INV1. If needed, a delay circuit B1 may be added in the feedback path to allow adjustment of the point that the drive is killed following inverter INV1 changing state.

The solution described herein adjusts the accelerator drive duration depending on the size of the capacitive load connected to the output. This allows for higher maximum frequency for light loads, but still ensures sufficient drive duration to drive heavier loads. It also allows better signal integrity into a transmission line load because a slower edge-rate can be used at the output, while maintaining the ability to drive heavy lumped loads—since the output drive stays on until the output reaches the desired state. In fixed duration accelerator stages, the maximum load that can be driven is determined by the output edge-rate and the fixed drive duration.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:
1. An accelerator output stage circuit comprising:
a high side output device coupled to an output node;
a low side output device coupled to the output node;
a first logic gate coupled to a control node of the high side output device;
a second logic gate coupled to a control node of the low side output device;
a high side one-shot device having an output coupled to a first input of the first logic gate, and having a high side resistor bypass device;
a low side one-shot device having an output coupled to a first input of the second logic gate, and having a low side resistor bypass device; and a feedback device coupled between the output node and a second input of the first logic gate, and between the output node and a second input of the second logic gate, and between the output node and an input to the high side resistor bypass device, and between the output node and an input to the low side resistor bypass device.

2. The circuit of claim 1 wherein the high side resistor bypass device is a first transistor, and the low side resistor bypass device is a second transistor.

3. The circuit of claim 1 wherein the feedback device is an inverter.

4. The circuit of claim 3 further comprising a delay buffer coupled in series with the inverter.

5. The circuit of claim 1 wherein the high side one-shot device comprises:
- a third logic gate having an output coupled to the first input of the first logic gate, and a first input coupled to a one-shot input node;
- a first transistor coupled to a second input of the third logic gate, and having a control node coupled to the one-shot input node; and
- a second transistor coupled in series with the first transistor, and having a control node coupled to the one-shot input node.

6. The circuit of claim 5 further comprising a resistance coupled between the first and second transistors.

7. The circuit of claim 6 wherein the high side resistor bypass device is coupled to the resistance.

8. The circuit of claim 7 wherein the high side resistor bypass device is a transistor coupled in parallel with the resistance.

9. The circuit of claim 5 wherein the first logic gate is a NAND gate and the third logic gate is a NOR gate.

10. The circuit of claim 1 wherein the low side one-shot device comprises:
- a third logic gate having an output coupled to the first input of the second logic gate, and a first input coupled to a one-shot input node;
- a first transistor coupled to a second input of the third logic gate, and having a control node coupled to the one-shot input node; and
- a second transistor coupled in series with the first transistor, and having a control node coupled to the one-shot input node.

11. The circuit of claim 10 further comprising a resistance coupled between the first and second transistors.

12. The circuit of claim 11 wherein the low side resistor bypass device is coupled to the resistance.

13. The circuit of claim 12 wherein the low side resistor bypass device is a transistor coupled in parallel with the resistance.

14. The circuit of claim 10 wherein the second logic gate is a NOR gate and the third logic gate is a NAND gate.

15. The circuit of claim 1 wherein the high side output device is a P channel device and the low side output device is an N channel device.

* * * * *